(12) United States Patent
Laschinski et al.

(10) Patent No.: US 9,136,688 B2
(45) Date of Patent: Sep. 15, 2015

(54) METHOD AND SYSTEM FOR DETECTING AN ARC FAULT IN A POWER CIRCUIT

(71) Applicant: SMA Solar Technology AG, Niestetal (DE)

(72) Inventors: Joachim Laschinski, Kassel (DE); Marcel Kratochvil, Kassel (DE); Markus Hopf, Espenau (DE); Andreas Falk, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 40 days.

(21) Appl. No.: 13/974,194

(22) Filed: Aug. 23, 2013

(65) Prior Publication Data
US 2013/0335861 A1    Dec. 19, 2013

Related U.S. Application Data

(63) Continuation of application No. PCT/EP2011/052897, filed on Feb. 11, 2011.

(51) Int. Cl.
| | |
|---|---|
| H02H 3/00 | (2006.01) |
| H02H 1/00 | (2006.01) |
| H02J 3/38 | (2006.01) |
| H02H 3/16 | (2006.01) |
| H01L 31/02 | (2006.01) |

(52) U.S. Cl.
CPC ........ *H02H 1/0015* (2013.01); *H01L 31/02021* (2013.01); *H02H 3/16* (2013.01); *H02J 3/383* (2013.01)

(58) Field of Classification Search
USPC ..................................... 361/42–50
See application file for complete search history.

(56) References Cited

U.S. PATENT DOCUMENTS

| 2008/0180866 A1 | 7/2008 | Wong | |
|---|---|---|---|
| 2011/0019444 A1* | 1/2011 | Dargatz et al. | 363/50 |
| 2011/0301772 A1* | 12/2011 | Zuercher et al. | 700/293 |

FOREIGN PATENT DOCUMENTS

| CN | 1529929 A | 9/2004 |
|---|---|---|
| WO | 9422031 A1 | 9/1994 |
| WO | 2011017721 A1 | 2/2011 |

OTHER PUBLICATIONS

International Search Report dated Nov. 21, 2011 in connection with International Application No. PCT/EP2011/052897.

\* cited by examiner

*Primary Examiner* — Danny Nguyen
(74) *Attorney, Agent, or Firm* — Eschweiler & Associates, LLC

(57) ABSTRACT

The method of detecting an arc fault in a power circuit includes determining a first signal related to current flowing in the power circuit is determined and analyzing the first signal to determine whether the signal indicates the presence of an electric arc in the power circuit. In case the first signal indicates the presence of an electric arc in the power circuit, means for suppressing an electric arc are activated. A second signal related to current flowing in the power circuit is then determined and analyzed. An occurrence of an arc fault in the power circuit is signaled if the second signal does not indicate the presence of an electric arc. The system for detecting an arc fault is designed to perform a corresponding method.

14 Claims, 5 Drawing Sheets ance. The disclosure
further relates to an arc fault detection system
and a photovoltaic system comprising a corresponding detection system.

BACKGROUND

A power circuit, in particular DC (Direct Current)-power circuits that work with high voltages and high currents, for example, in photovoltaic systems or systems providing off-grid power supply, are prone to the development of electric arcs. Electric arcs can, for example, occur when a power line with a high current load is interrupted during maintenance or in case contacts at interconnectors are degraded. Other possible causes for arc faults, i.e. the occurrence of an electric arc in the power circuit, are corroded solder joints or broken insulators of the power lines. Arc faults are the most common fire causes in photovoltaic systems. This also reflects in the requirements for arc fault protection for photovoltaic systems as, for example, regulated by the national Electric Code (NEC) 690.11 of the United States of America implemented in 2011.

A reliable arc fault detection method and system is therefore of major importance. On the one hand, for security reasons the existence of an arc fault has to be detected with a reliability as high as possible. On the other hand, the probability of an erroneous indication of a supposed arc fault has to be as low as possible, in particular if an erroneous detection of an arc fault might lead to a shutdown of a photovoltaic system without the option to automatically restart it, as for example specified in the before mentioned NEC 690.11 code.

Electric arcs usually emit a broadband AC (Alternating Current)-signal in an RF (Radio Frequency)-frequency range. Detection systems for arc faults that are based on detecting a according radio frequency signal in the power circuit are well established and known from document WO 95/25374, for example. A problem associated with the detection of arc faults via their current signature in the RF-frequency range is that disturbing RF-signals might be present in a power circuit that are misinterpreted and are wrongly assigned to arc faults, which finally leads to a nuisance alarm situation. Possible sources of disturbing signals are for example RF-radio transmitter, electric trains or trams passing by, electric or electronic devices with an insufficient electro-magnetic shielding or interference suppression, or arcs in adjacent power systems. In the following, all possible RF-sources other than an arc fault in the respective power system are hereinafter referred to as a "disturber".

In order to increase the detection reliability document U.S. Pat. No. 7,633,727 B2 discloses an arc fault detection system comprising two narrowband band pass filters operating at different frequencies. An arc fault is determined to be existent only if a radio frequency signal is observed on both frequency bands of the two band pass filters. However, in case a disturbing signal shows a frequency spectrum that is similarly broad as the typical frequency spectrum of an electric arc, this disturbing signal cannot be distinguished from a signal arising from an arc fault.

It is thus desirable to create a robust and reliable method and system for detecting arc faults in a power circuit. It is furthermore desirable to describe a photovoltaic system with a corresponding detection system.

SUMMARY

According to a first aspect of the disclosure, a method of detecting an arc fault in a power circuit comprises determining a first signal related to current flowing in the power circuit. The method further comprises analyzing the first signal to determine whether the signal indicates the presence of an electric arc in the power circuit. In a case where the first signal indicates the presence of an electric arc in the power circuit, the method comprises activating a means for suppressing an electric arc. A second signal related to the current flowing in the power circuit is then determined and analyzed. An occurrence of an arc fault in the power circuit is signaled if the second signal does not indicate the presence of an electric arc.

In the above manner it is tested whether activating a means for suppressing an arc affects the signals that indicate the presence of an arc fault. Only if the outcome of this test is positive, the signal observed originated from an electric arc with a very high probability and an arc fault is signaled. Assuming that a signal originating from a disturber is not affected by the means for suppressing an arc, a negative result of the test indicates that a disturber rather than an arc is the source of the observed signal. The method thus provides a possibility to discriminate between arcs and disturbers. Arc faults are detected more reliably and nuisance alarm situations can accordingly be prevented.

In one embodiment of the method, analyzing the first and/or second signal comprises determining whether an AC-component is present in the signal, wherein the presence of an AC-component in the signal is regarded as an indication of the presence of an electric arc. This way, the technique of arc-detection based on the observation of an AC-signal in a power circuit can be utilized within the inventive method. In one embodiment, activating the means for suppressing an electric arc does not preclude that an alternating current can flow in the power circuit. This allows for a discrimination between arcs and disturbers.

In a further embodiment of the method, activating means for suppressing the electric arc comprises an operation of a short-circuit switch and/or a circuit breaker. A short-circuit switch and a circuit breaker are robust and inexpensive means for suppressing an arc.

In a further embodiment of the method, the means for suppressing an electric arc are kept activated after having signaled the occurrence of an arc fault. This way, security measures, e.g. according to NEC 690.11, are met.

In a further embodiment of the method, in a case that the second signal still indicates the presence of an electric arc, the process of analyzing the signals is optimized in that the actual signal is no longer regarded as an indication for the presence of an electric arc. If the second signal still indicates the presence of an electric arc, a disturber is very likely the source of the observed signal. This knowledge can then be utilized to optimize the process of analyzing the signal, e.g. by varying parameters of the process such that no signal is observed any more, i.e. that the disturbing signal is suppressed and not seen as an indication of an arc fault.

In a further embodiment of the method, a time-span between activating and deactivating the means for suppressing an electric arc is shorter than a typical re-ignition time of an arc fault. This way, a further characteristic behavior of an arc, namely the fact that it self-ignites if it has been suppressed only for a short period of time, is used for further discrimination between an arc and a disturber. In this respect, it is desirable in one embodiment to perform the following additional acts if the second signal does not indicate the presence of an electric arc: The means for suppressing an electric arc are deactivated and a third signal related to current flowing in the power circuit is determined and analyzed. The occurrence of an arc fault in the power circuit is then signaled, if the third signal indicates the presence of an electric arc.

According to a second aspect of the disclosure, an arc fault detection system comprises a control unit with an arc indicator and means for suppressing an electric arc. The arc fault detection system is configured to perform a method according to the first aspect. The same advantages as described in connection with the first aspect arise.

In one embodiment of the arc fault detection system, the means for suppressing an electric arc comprise a short-circuit switch and/or a circuit breaker. Short-circuit switches and circuit breakers are robust and inexpensive means for suppressing an arc. Further, a capacitor is provided in parallel to a switching path of the circuit breaker in one embodiment. This way, an AC-current signal can pass an activated (i.e. open) circuit breaker and can accordingly be observed.

In a further embodiment of the arc fault detection system, an inverter bridge of an inverter is used as the short-circuit switch and/or the circuit breaker. This way, a short-circuit switch and/or a circuit breaker can be implemented without using additional, separate elements like electro-mechanical switches. Rather, advantage is taken of components of an inverter that are present anyway, namely one or more inverter bridges comprising switches, usually semiconductor-switches.

In a further embodiment of the arc fault detection system, a pick-up coil is used as a current sensor connected to the arc indicator of the control unit. This provides a cost-effective way to derive an AC-signal from the power circuit.

According to a third aspect of the disclosure, a power system, in particular a photovoltaic power system, comprises an arc fault detection system according to the second aspect of the disclosure. The same advantages as described in connection with the first aspect and the second aspect arise.

In one embodiment of the power system, the arc fault detection system is fully or partially integrated into an inverter of the power system. This way, a compact system can be designed. Additionally, control systems and/or semiconductor power switches present in an inverter can be used within the arc fault detection system without having some components redundant in the power system.

BRIEF DESCRIPTION OF THE DRAWINGS

The disclosure is now described in more detail and will be fully understood with reference to the following detailed description in conjunction with the drawings. The drawings show.

DETAILED DESCRIPTION

Figure 1:
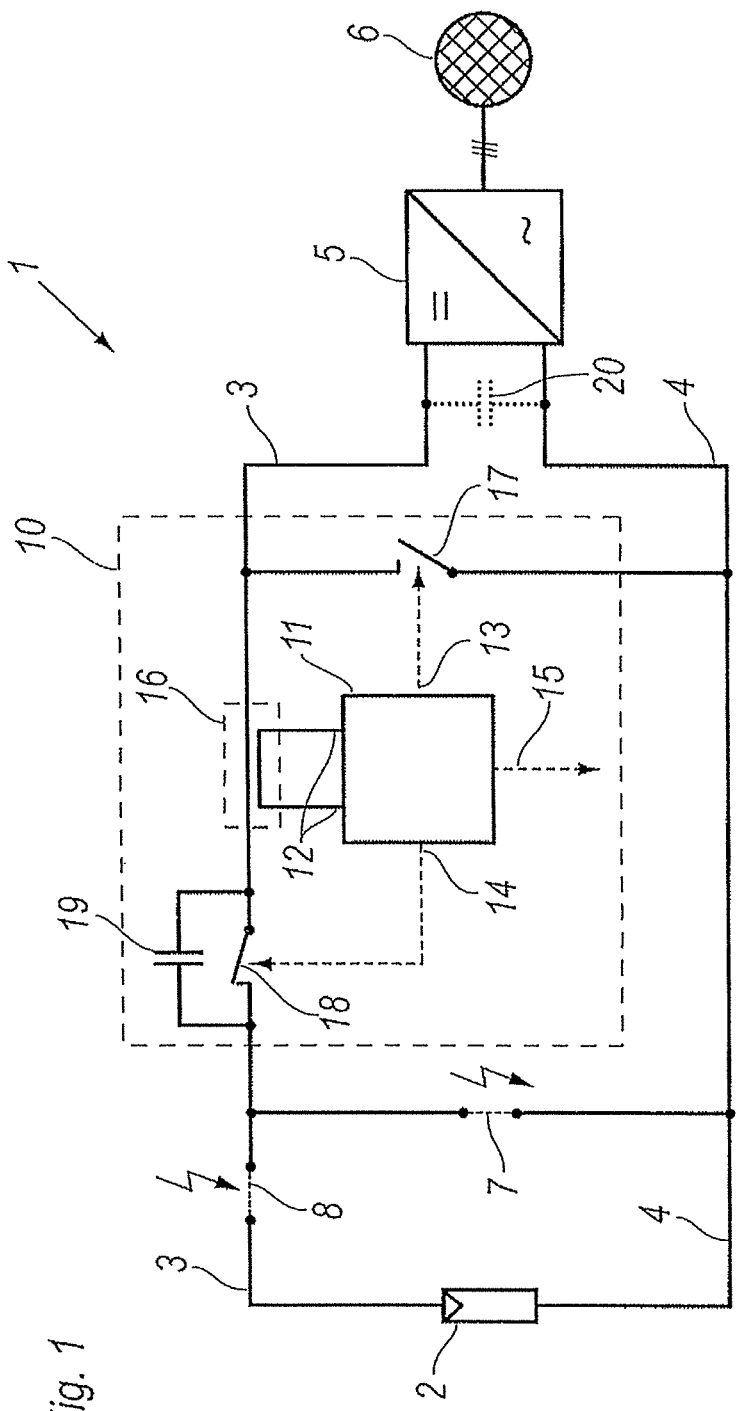
FIG. 1 a schematic wiring diagram of a photovoltaic system with an arc fault detection system.

FIG. 1 shows a photovoltaic system 1, in the following abbreviated as PV-system 1, in a schematic wiring diagram. The PV-system 1 comprises a photovoltaic generator 2 (PV-generator 2) that is connected to an inverter 5, e.g. a DC/AC (Direct Current/Alternating Current)-converter, by way of DC-power lines 3,4. The inverter 5 is connected to a power grid 6 on its AC-side.

The power grid 6 can either be a private or a public power grid. By way of example the power grid 6 is a 3-phase system and the inverter 5 is designed to feed in all 3-phases. However, the disclosure contemplates application of the principles herein with a power grid and/or inverter operating with any number of phases, for example, one or two phases.

Also by way of example, the PV-generator 2 is symbolized by the circuit symbol of a single photovoltaic cell. In a realization of the shown PV-system 1, the PV-generator 2 can be, for example, a single photovoltaic module (PV-module) that itself comprises a plurality of photovoltaic cells. In another embodiment, the PV-generator 2 can comprise a plurality of PV-modules that, for example, are connected in series and form a so-called string. Furthermore, a parallel connection or a combined serial/parallel connection of PV-modules is possible.

Two different kinds of arc faults that can occur in the power circuit formed by the PV-generator 2, the power lines 3, 4 and the input state of the inverter 5 are depicted in FIG. 1. The first kind is a parallel arc 7 burning in parallel to the PV-generator 2 as the power source of the power circuit. The second kind is a series arc 8 that is electrically in series with the PV-generator 2 and located at an interruption within one of the power lines 3, 4. The two different kinds of arc 7, 8 are symbolized in FIG. 1. By way of example, the series arc 8 is located in power line 3. Also by way of example, the parallel arc 7 is located in parallel to the PV-generator 2. Generally, parallel arcs can develop between two points with different potentials. A parallel arc can thus also develop in parallel to a part of the PV-generator 2, e.g. be located in parallel to a single PV-module.

Furthermore, as a special case of a parallel arc, an electric arc can also develop against ground potential, for example in a situation, in which the power lines 3, 4 are installed in grounded metal pipes. An arc against ground potential is referred to as a ground arc in the following. A ground arc can, for example, develop between one of the power lines 3, 4 and ground potential, if the other power line 4, 3 is intentionally or unintentionally grounded.

The PV-system 1 of FIG. 1 further comprises an arc fault detection system 10. The system 10 comprises a control unit 11 with a signal input 12, control outputs 13, 14 and a signal output 15. The control unit 11 is connected to a current sensor 16 via the signal input 12. By way of example the current sensor 16 is realized as a pick-up coil assigned to the power line 3. The pick-up coil can, for example, be designed as a Rogowski coil. Also, a transformer can be used as a current sensor. In alternative embodiments, other known types of current sensors can be used. Particularly suitable are, for example, hall sensors or shunts with a low ohmic resistance. Within the control unit 11, the signal input 12 is connected to an arc indicator that analyzes the measured current signal and determines, whether the measured current signal indicates the presence of an electric arc based on the presence of an AC-component in the power circuit, e.g. by means of a band-pass filter and an envelope-decoder. It is noted that instead of using a current sensor and analyzing the measured current signal, a voltage within the power circuit, e.g. the voltage at the input of the inverter 5, can be measured directly in order to analyze whether an electric arc is indicated. However, as described below, analyzing the current offers the possibility to distinguish between parallel and serial arcs.

Each control output 13, 14 is connected to a means for interrupting an arc fault that has developed within the circuit. The first control output 13 is connected to a control input of a short-circuit switch 17, which is suitable to short-circuit the PV-generator 2. The second control output 14 is connected to a circuit breaker 18, which is located in the power line 3 and suitable to interrupt a current flowing in the power line 3. The short-circuit switch 17 and the circuit breaker 18 can, for example, be electromagnetically operated power switches or, alternatively, can be based on semi-conductor devices (power transistors, solid state relays). In an advantageous embodiment the system 10 for detecting electric arcs or parts of this system 10 can be integrated into the inverter 5. This applies to the control unit 11 as well as to the means for interrupting an arc. In respect of the latter case, it is, for example, possible to use semiconductor power switches of inverter- or booster-bridges of the inverter 5 as the circuit-breaker or also as the short-circuit switch.

Operation of the short current switch 17 leads to a shortening of the PV-generator 2, which in turn lowers the voltage between power line 3 and power line 4 to an extent that any parallel arc 7 is extinguished. It is noted that ground arcs as a special case of parallel arcs are extinguished as well. Operation of the circuit breaker 18, i.e. opening its contacts, interrupts the current flow from the PV-generator 2 to the inverter 5 and thus extinguishes any series arc 8. Of course, a circuit breaker 18 that operates inversely such that the contacts are closed when the circuit breaker 18 is activated, can as well be used if an inverse control signal is used.

A capacitor 19 is connected in parallel to the contacts (or, more generally, the switching path) of the circuit breaker 18. It allows alternating currents to still flow in the power circuit, even if the circuit breaker 18 is operated. As a result, an AC-signal that does not originate from a series arc 8 could still be observed when the circuit breaker 18 is operated, which can advantageously be utilized to determine whether a disturber is or an arc had been the origin of the AC-signal (see below in connection with FIG. 2). In case the input stage of the inverter 5 has a high impedance for higher frequencies, for the same reason a capacitor 20, depicted by a dashed line in FIG. 1, might be connected in parallel to the input of the inverter 5. Often, a suitable capacitor is already present in the input stage of an inverter, e.g. as part of an EMC (Electro-magnetic Compatibility)-filter.

The functionality of the system 10 and its components will be described in detail in the following.

Figure 2:
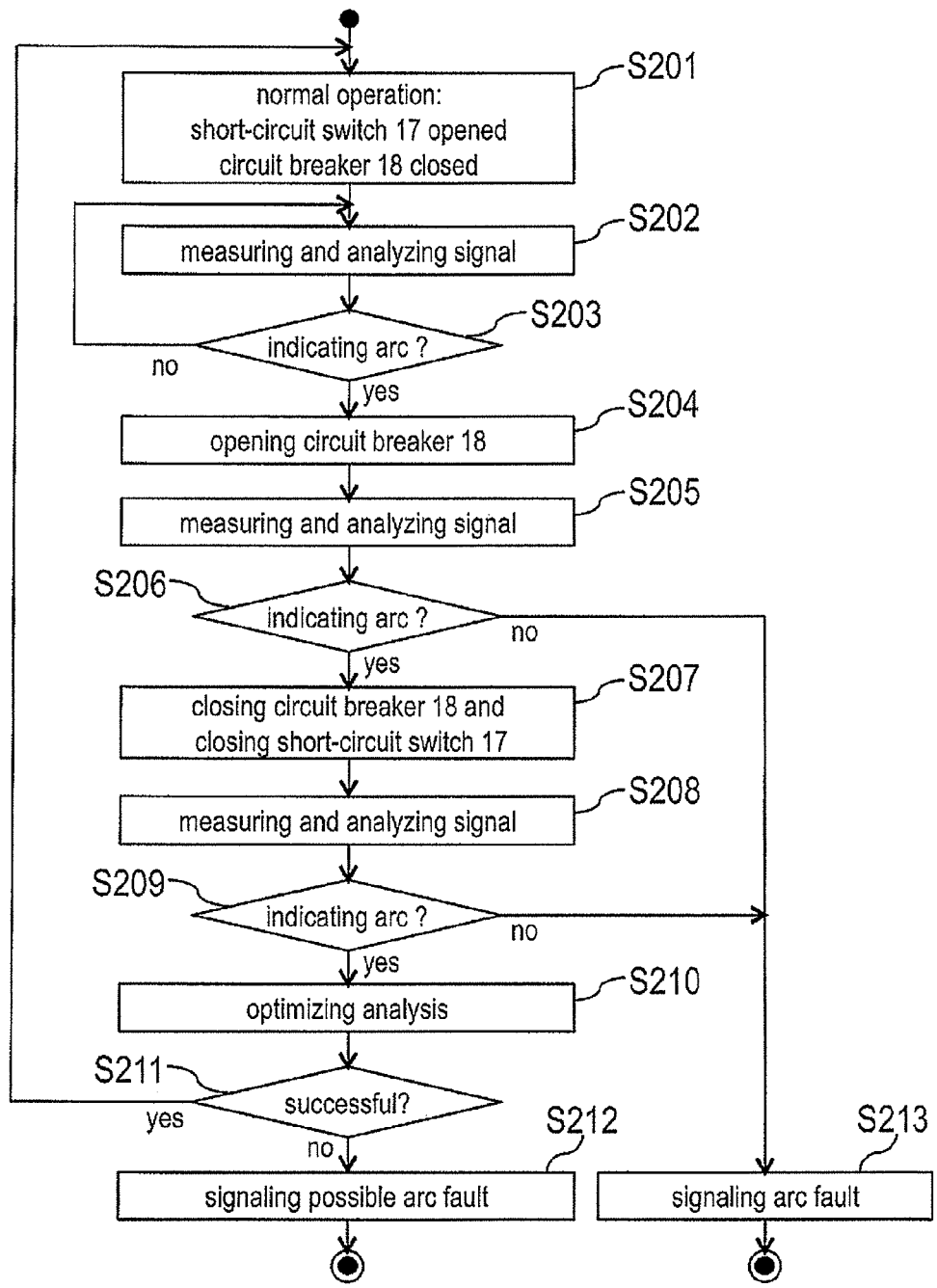
FIG. 2 a flow chart of an embodiment of a method for detecting the presence of an electric arc in a power circuit.

FIG. 2 shows a flow chart of a method for detecting electric arcs in a power circuit. The method can, for example, be performed by a protection system 10 shown in FIG. 1. Without any limitation it will therefore by way of example be described with reference to FIG. 1.

At S201 the power circuit, for example, the photovoltaic system 1 shown in FIG. 1, is operated in a normal working condition. Accordingly, the control unit 11 controls, via its control output 13, 14, the short-circuit switch 17 to be opened and the circuit breaker 18 to be closed.

At S202, a first signal of current flowing in the power circuit is measured and analyzed. In one embodiment the first signal is a signal that is related to ACcomponents of current flowing in the power circuit. As described before, electric arcs usually emit a high frequency signal which is super-imposed on the current provided by the current source of the power circuit. In the embodiment shown in FIG. 1, the power source is the PV-generator 2 which provides a DC current flowing through the power lines 3 and 4. AC-components of the current are picked up by the current sensors 16 and transmitted to the control unit 11. The current is then analyzed, whether parameters of the first signal indicate the presence of an electric arc in the power circuit. This can, for example, be done by using one or more band pass filters and analyzing whether frequency components characteristic for a burning arc are observed. It is noted that any analyzing method that indicates whether an electric arc might be present can be utilized here.

At S203, the method branches back to S202 in the case no arc is indicated. In case analyzing the signal at S202 indicates an electric arc, the method proceeds to S204. It is emphasized that the signal output 15 is not set to a level that signals the presence of an electric arc in the power circuit at this state. Rather, the following acts are performed in order to determine, whether the observed AC-signal indeed originated from an arc (series/parallel) or a disturber.

At S204, the control unit 11 issues a control signal to the control output 14 to operate the circuit breaker 18. Accordingly, the circuit breaker 18 is opened and the DC-current flow in the current circuit is interrupted. Due to the capacitor 19, which is connected in parallel to the circuit breaker 18, the operation of the circuit breaker 18 does not affect higher frequency AC-currents in the power circuit.

At S205, the signal determined by the current sensor is measured and analyzed again. Having opened the circuit breaker 18, i.e. having interrupted the DC-current flowing in the power circuit, a series arc 8 that could have been the origin for the observed first signal at S202 should now have become extinct. Accordingly, if the second signal at S205 does not indicate the presence of an arc any more, this can be seen as a proof that the first signal observed at S202 has indeed originated from the presence of a series electric arc 8. At S206, the method then branches to S213, where the control unit 11 signals the occurrence of an electric arc by setting the signal output 15 to an active level.

In one embodiment, the method could terminate at this point. In such a case, the signal output 15 could be connected to a visual and/or acoustic alarm indicator informing about the detected occurrence of an electric arc in the power circuit. The circuit breaker 18 is kept open in order to prevent the detected arc from igniting again. In this case, the requirement of the NEC 690.11 regulations to not automatically re-start the system is fulfilled.

In an alternative embodiment, which is particularly suited when an automatic re-start is not prohibited, the detection system 10 is first set up to resume normal operation according to S201. Then the acts following act S201 are repeated at least once again. Only if act S202 repeatedly indicates a presence of an electric arc, whereas act S205 does not indicate an arc, the method finally branches to S213. In order to trace actions of the detection system 10, a log system can be implemented in control unit 11. The log system logs all events that indicate the presence of an electric arc and/or all operations of the short-circuit switch 17 and/or the circuit breaker 18.

Figure 3:
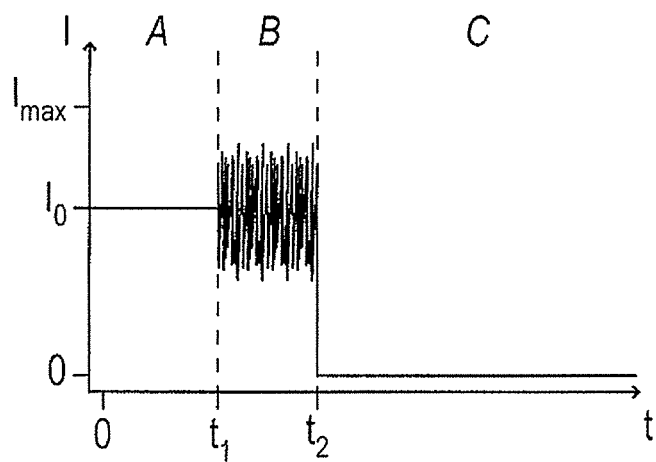
FIGS. 3 to 5 are schematic diagrams of current vs. time in a power circuit in different situations related to the detection of arc faults according to FIG. 2.

For the purpose of further illustration, FIG. 3 shows a situation as described above (acts S201 to S206 and S213) in the form of a current vs. time diagram. The abscissa of the diagram shows the proceeding time t in arbitrary units. The ordinate of the diagram shows the current I flowing in the power circuit. For a compelling description, the current I is shown with its DC-component. Thus, the current I shown differs from the signal analyzed by the control unit 11 of FIG. 1. In the embodiment of FIG. 1 a pick-up coil is used as the current sensor 16, i.e. the current sensor 16 is AC-coupled and does not transmit DC-components to the control unit 11.

In a first section A of the diagram at a time $t<t_1$, the PV-system 1 operates in normal operation condition as in the corresponding acts S201 to S203 of the method of FIG. 2, while act S202 does not show any indications of the presence of an arc. The current I is a DC-current exhibiting a normal operation current value $I_0$. In a section B commencing at a time $t_1$, the current I shows alternating components which lead to a fluctuation of the current I around the normal operation current $I_0$. Measurement and analysis of the signal in section B of FIG. 3 leads to a branch of the method to S204 in FIG. 2, where the circuit breaker 18 is opened.

As described in connection with acts S205 and S206 of FIG. 2, the signal is measured and analyzed again after the circuit breaker 18 has been opened, i.e. after means for deleting an arc that might have possibly be the reason for the signal observed in section B were activated. The measurement performed in section C at a time $t>t_2$ shows a current equal to zero without any AC-components. Accordingly, with a very high probability the signal observed in section B had indeed originated from an electric arc. As a consequence, the circuit breaker 18 is kept open and an arc fault is being signaled. For easier maintenance it can advantageously also be indicated that the detected arc fault is a series arc fault.

Description of the flow chart of FIG. 2 is now continued for a case, in which act S206 does still indicate the presence of an electric arc. Having opened the circuit breaker 18 at S204 would have extinguished any serial arc present in the power circuit. The fact that an arc is still indicated at S206 shows that the signal observed in acts S202 and S205 originated from either a disturber or a parallel arc 7.

In that case, the method proceeds to S207, in which the circuit breaker 18 is closed again and the short-circuit switch 17, as a means for extinguishing a possible parallel arc, is operated, i.e. closed, in order to be able to distinguish between the two possible origins of the observed AC-signal.

At S208, the signal is measured and analyzed again. If, in a subsequent act S209, it is found that the analyzed signal does not indicate the presence of an electric arc, this can be regarded as a proof that the signal observed in acts S202 and S205 originated from a parallel arc. Accordingly, the method again branches to S213, where an arc fault is signaled. For easier maintenance it can advantageously also be indicated that the detected arc fault is a parallel arc fault.

Figure 4:
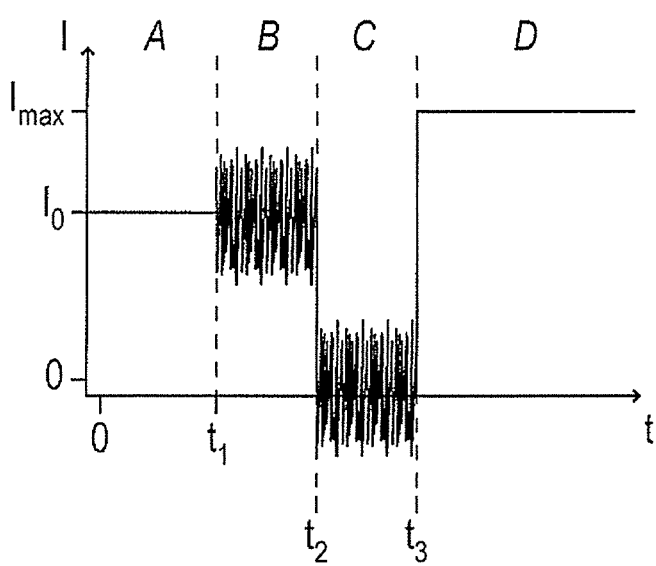

The situation as described so far (acts S201 to S209 and S213) is again illustrated in the form of a current vs. time diagram shown in FIG. 4. For the general description of the diagram and the shown quantities it is referred to the description of FIG. 3. Furthermore, the run of the current curve of FIG. 4 is the same as in FIG. 3 in sections A and B. The signal then differs in section C after having opened the circuit breaker 18 (act S204) in that AC-components are still observed. At a time $t=t_3$ the circuit breaker 18 is closed again and the short-circuit switch 17 is closed as well (act S207), which leads to an increase of the current I to its maximum value $I_{max}$ in the short-circuit case in a section D. In section D, no AC-current components are observed, which shows that with a high probability the signal observed in sections B and C had originated from a parallel electric arc. Accordingly, the short-circuit switch 17 is kept closed and an arc fault is being signaled (act S213).

The description of the flow chart of FIG. 2 is now continued with a case, in which the signal measured and analyzed at S208 does indicate the presence of an electric arc. In that case, the method proceeds from act S209 to act S210. At this stage of the method it can with a high probability be excluded that an electric arc is the origin for the observed signal in acts S202, S205 and S208. On the contrary it is highly probable that the observed signal originates from a disturber.

Making use of this knowledge, the process of analyzing the signals is now optimized at S210. Please note that acts S210 and S211 are optional and do not necessarily have to be present in a method according to this application. As mentioned before, electric arcs are characterized in that they emit an AC-signal with a broad frequency spectrum. If, by way of example, the process of analyzing the signal is based on the observation of an AC-component at a single frequency, e.g. by using a single band-pass filter, the frequency of the band-pass filter can be adapted in order to optimize the analysis. The frequency of the band-pass filter is varied in order to find a frequency at which the signal (after having passed the filter) does not show any characteristic AC-components, albeit the frequency is located within the frequency range characteristic for electric arcs. If a band-pass frequency fulfilling these criteria can be found, it is established that the signal observed beforehand was due to a disturber. Since the influence of the disturber on the detector circuit is now eliminated, normal operation of the system can be resumed. In the flow chart this is indicated by a branch of the method from act S211, in which the success of the optimization procedure is tested, back to S201.

Figure 5:
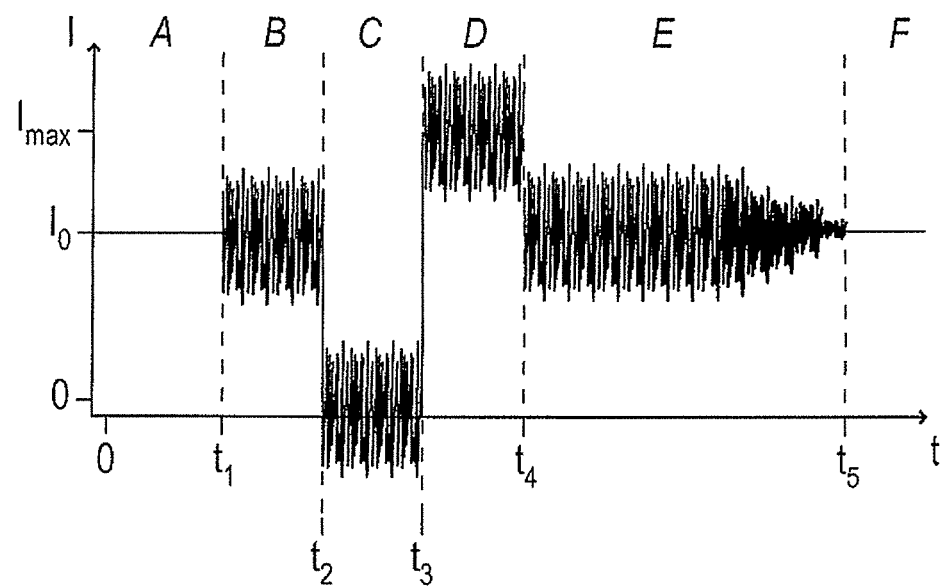

The situation is again illustrated in a current vs. time diagram in FIG. 5. For $t<t_3$ the diagram corresponds to the diagram shown in FIG. 4. In contrast to the diagram of FIG. 4, the presence of an arc is still signaled in section D, as a result of which the analysis is optimized in a section E. As apparent from the mean current value in section E, the optimization procedure is performed at the normal working current $I_0$, meaning that the short-circuit switch 17 is opened and the circuit breaker 18 is being closed. However, in alternative embodiments the optimization process might be performed within section D with the short-circuit switch 17 and the circuit-breaker 18 remaining unchanged, i.e. with the circuit breaker 18 and the short-circuit switch 17 still being closed.

In section E, the frequency of the band pass filter used to analyze the signal is tuned in frequency, for example it is increased and/or decreased in frequency. In the shown case the optimization procedure is successful and the amplitude of the AC-component decreases. The frequency spectrum of the disturbing signal is completely blanked out in the relevant signal that passed the band-pass filter. Accordingly, at a time $t_5$, that corresponds to S211 of FIG. 2, the optimization procedure is regarded to have been successfully completed and normal operation according to S201 is resumed in section F of FIG. 5.

Referring again to FIG. 2, the method otherwise terminates at S212 if act S211 indicates that the optimization process at S210 has not been successful. At S212, a possible occurrence of an arc fault is being signaled. In this state it was neither possible to clearly identify an arc fault, nor to tune the arc fault detection system to an undisturbed mode of operation.

Figure 6:
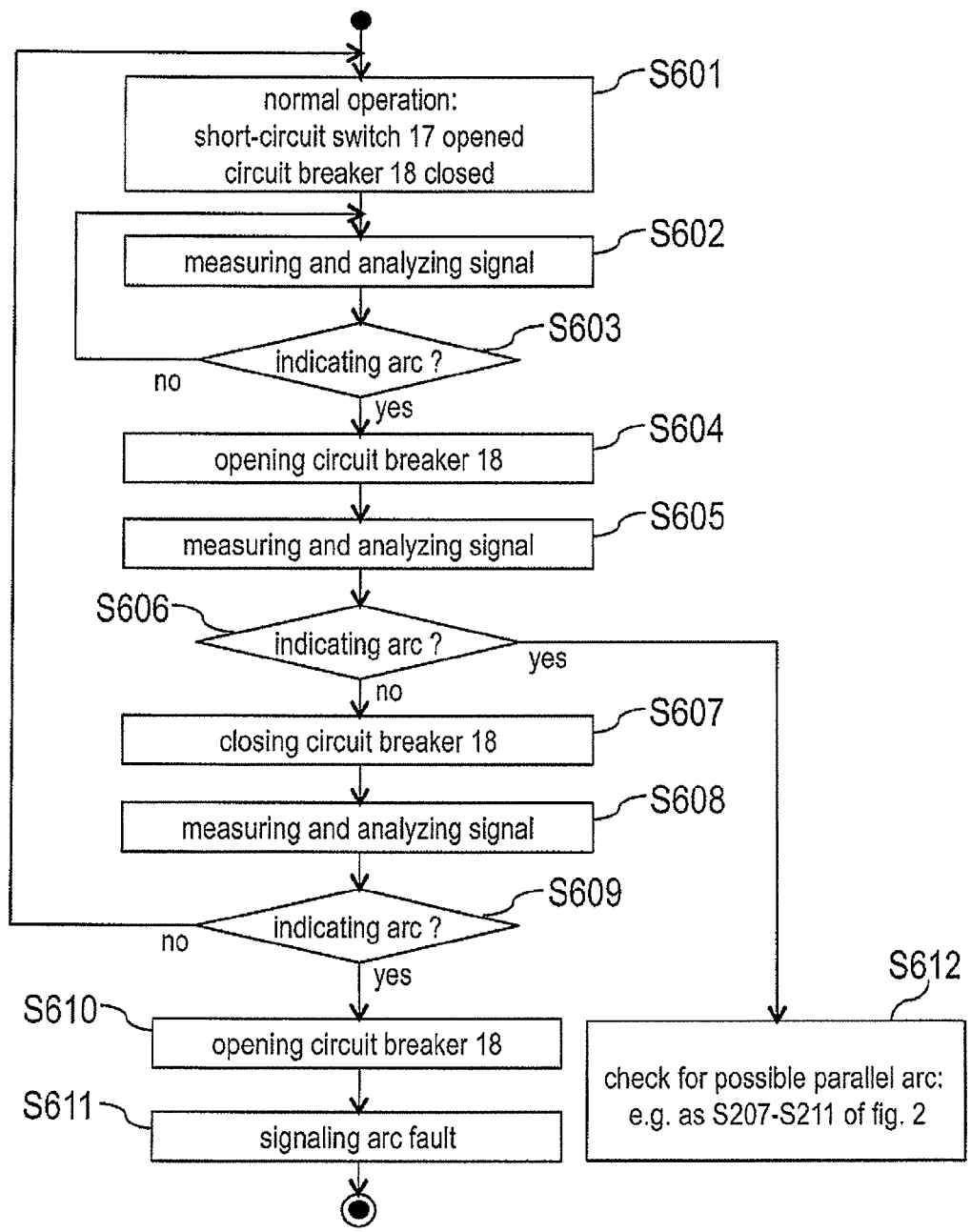
FIG. 6 a flow chart of a further embodiment of a method for detecting the presence of an electric arc in a power circuit.

FIG. 6 shows a flow chart of an alternative embodiment of a method for detecting arc faults. This method can also be, for example, performed by the photovoltaic system as shown in FIG. 1.

Acts S601 to S606 are identical to acts S201 to S206 of the flow chart of FIG. 2. For a description of these acts, reference is made to the respective parts of the description of the embodiment shown in FIG. 2.

In case the signal measured and analyzed at S602, as well as the signal measured and analyzed at S605 indicate the presence of an electric arc, the method shown in FIG. 6 branches from act S606 to further acts S612 to test whether a parallel arc exists. According acts are not shown in detail here. It will be appreciated that for example acts S207 to S212 of the embodiment shown in FIG. 2 are suited in this respect.

The method shown in FIG. 6 differs from the one shown in FIG. 2 in the case, where the signal measured and analyzed at S602 indicates an electric arc, whereas the signal measured and analyzed at S605 does not. The method then branches to S607, in which the circuit breaker 18 is closed again. For all method acts described so far, the chronological order of the acts was of main interest and has been discussed without consideration of the duration of an individual act or a delay time between successive acts. In the embodiment of the method described in FIG. 6 it is important that the time delay between opening the circuit breaker 18 at S604 and closing it again at S607 is short enough for an arc to ignite again due to plasma produced by the arc still being existent. In a following act S608, the signal is measured and analyzed once more. If the signal now again indicates the presence of an electric arc, the assumption that an arc caused the AC-signals is supported. Correspondingly the method branches from act S609 to act S610, in which the circuit breaker 18 is opened again and an arc fault, and more particularly a serial arc fault, is signaled.

If the signal measured at S608 does not indicate the presence of an arc, it can be assumed with a high probability that the signal observed at S602 was due to a disturber rather than an arc. The fact that it had not been observed at S605 can be assigned to a disturber that emitted the disturbing signal for a very short period only. Accordingly, the method branches back to S601 and the system resumes normal operation.

In alternative embodiments of the shown method the sequence of acts S604 to S609 can be passed repeatedly in order to be able to distinguish between arcs and an external disturber with even higher significance. To enhance the significance of the method against interference also of a periodically emitting disturber, a delay time can be introduced between each repetition. The delay time can additionally be varied, for example randomly, in different repetitions of the sequence.

It is noted that the same basic idea of applying means for extinguishing an arc for a short time only can similarly be applied to acts S207 to S209 of FIG. 2 for the case of parallel arcs.

Figure 7:
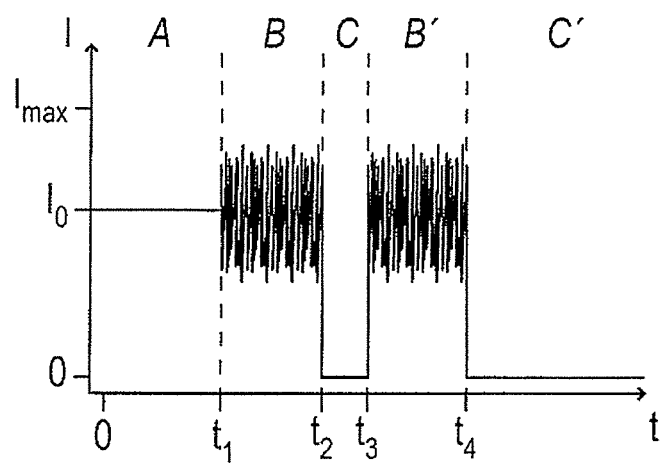
FIG. 7 a schematic diagram of current vs. time in a power circuit in a situation related to the detection of arc faults according to FIG. 6.

FIG. 7 illustrates the method shown in FIG. 6 again in the form of a current vs. time diagram. Sections A, B and C of the diagram corresponding to acts S601 to S606 of FIG. 6 are identical to the respective sections of FIG. 3. In contrast to the embodiment shown in FIG. 3, section C that starts at a time $t_2$ and ends at a time $t_3$ is kept so short that the duration $\Delta t=t_3-t_2$ of section C is shorter than a re-ignition period of an arc. In a following section B' that corresponds to S607 and S608 of FIG. 6, the AC-component indicative of an electric arc is observed again. As a consequence, an arc fault is assumed to be detected with a high significance. In a final section C' the circuit breaker 18 is then opened again and an arc fault is signaled according to act S610 and act S611 of FIG. 6.

It is noted that in all embodiments described above, operation of the short-circuit switch 17 can be performed before operation of the circuit-breaker 18. In other words, the sequence for determining a possible presence of a parallel arc can be performed before rather than after the sequence for determining a possible serial arc. It is also possible to simultaneously operate the short-circuit switch 17 and the circuit-breaker 18 in order to distinguish between an arc and a disturber. In the latter case no discrimination between parallel and serial arcs is possible. Furthermore, the PV-system can be designed with only one means for extinguishing electric arcs that is capable of extinguishing serial as well as parallel arcs. In a PV-system this can, for example, be realized with either a circuit breaker or a short-circuit switch being mounted in close proximity to the photovoltaic modules that make up the PV-generator, in particular mounted within a junction-box attached to a photovoltaic module itself. In this case it can again not be differentiated between parallel and serial arcs. In a further alternative embodiment of a power system either the means for extinguishing a parallel arc or the means for extinguishing a series arc is provided. This is suited in a case, where only one of the two kinds of arcs can occur according to the construction of the power system.

It is finally noted that the foregoing description and the drawings are examples and not restrictive and that the disclosure is not limited to the disclosed embodiments. Other variations to the disclosed embodiments can be understood and effected by those skilled in the art from a study of the drawings, the disclosure, and the appended claims.

The invention claimed is:

1. A method of detecting an arc fault in a power circuit, comprising:
   determining a first signal related to current flowing in the power circuit;
   analyzing the first signal and determining whether the first signal indicates the presence of an electric arc in the power circuit;
   in case the first signal indicates the presence of an electric arc in the power circuit, activating means for suppressing an electric arc;
   determining and analyzing a second signal related to current flowing in the power circuit upon the first signal indicating the presence of an electric arc; and
   signaling the occurrence of an arc fault in the power circuit if the second signal does not indicate the presence of an electric arc,
   wherein in the case that the second signal still indicates the presence of an electric arc, further comprising performing an optimization analysis on another signal, wherein if the another signal satisfies a predetermined criteria then the first signal is no longer regarded as an indication for the presence of an electric arc.

2. The method of claim 1, wherein analyzing the first signal and/or the second signal comprises determining whether an AC-component is present in the respective first signal and/or second signal, and wherein the presence of an AC-component in the first signal is regarded as an indication of the presence of an electric arc.

3. The method of claim 1, wherein activating the means for suppressing an electric arc does not preclude an alternating current flowing in the power circuit.

4. The method of claim 1, wherein activating the means for suppressing the electric arc comprises an operation of a short-circuit switch and/or a circuit breaker.

5. The method of claim 1, wherein the means for suppressing an electric arc are kept activated after having signaled the occurrence of an arc fault.

6. A method of detecting an arc fault in a power circuit, comprising:
   determining a first signal related to current flowing in the power circuit;
   analyzing the first signal and determining whether the first signal indicates the presence of an electric arc in the power circuit;

in case the first signal indicates the presence of an electric arc in the power circuit, activating means for suppressing an electric arc;

determining and analyzing a second signal related to current flowing in the power circuit upon the first signal indicating the presence of an electric arc; and signaling the occurrence of an arc fault in the power circuit if the second signal does not indicate the presence of an electric arc, wherein a time-span between activating and deactivating the means for suppressing an electric arc is shorter than a typical re-ignition time of an arc fault.

7. The method of claim 6, wherein if the second signal does not indicate the presence of an electric arc:

de-activating the means for suppressing an electric arc;

determining and analyzing a third signal related to current flowing in the power circuit; and signaling the occurrence of an arc fault in the power circuit if the third signal indicates the presence of an electric arc.

8. An arc fault detection system comprising a control unit with an arc indicator and means for suppressing an electric arc, designed to perform a method, comprising:

determining a first signal related to current flowing in the power circuit;

analyzing the first signal and determining whether the first signal indicates the presence of an electric arc in the power circuit;

in case the first signal indicates the presence of an electric arc in the power circuit, activating means for suppressing an electric arc, wherein the means for suppressing an electric arc comprise a short-circuit switch and/or a circuit breaker, and wherein a capacitor is provided in parallel to a switching path of the circuit breaker;

determining and analyzing a second signal related to current flowing in the power circuit upon the first signal indicating the presence of an electric arc; and signaling the occurrence of an arc fault in the power circuit if the second signal does not indicate the presence of an electric arc.

9. The arc fault detection system of claim 8, wherein an inverter bridge of an inverter is used as the short-circuit switch and/or the circuit breaker.

10. The arc fault detection system of claim 8, further comprising a pick-up coil that is configured to operate as a current sensor connected to the arc indicator of the control unit.

11. A photovoltaic power system, comprising:

an inverter having first and second inputs configured to receive DC power thereat, and configured to convert the DC power to AC power at first and second outputs thereof;

an arc fault detection system, comprising:

a current sensor configured to sense a current at one of the first and second inputs of the inverter;

a first fault suppression device in series with the current sensor;

a control unit configured to receive a first signal from the current sensor and analyze a presence of an electric arc in the photovoltaic power system, and upon an affirmative determination of the presence of an electric arc activate the first fault suppression device in order to interrupt a DC current flow to the current sensor, wherein the control unit is further configured to receive a second signal from the current sensor upon activation of the first fault suppression device, and selectively output an arc fault notification signal depending on whether analysis of the second signal indicates a presence of an electric arc, wherein if the second signal does not indicate the presence of an electric arc the arc fault notification signal is output;

a second fault suppression device coupled between the first and second inputs of the inverter, and wherein if the second signal does indicate the presence of an electric arc, the control unit is configured to:

deactivate the first fault suppression device to thereby permit DC current flow to the current sensor;

activate the second fault suppression device in order to substantially short circuit the first and second inputs of the inverter; and analyze a third signal from the current sensor, and if the third signal does not indicate a presence of an electric arc the control unit outputs the arc fault notification signal.

12. The photovoltaic power system of claim 11, wherein if the third signal does indicate the presence of an electric arc, the control unit is configured to initiate an optimization analysis.

13. The photovoltaic power system of claim 12, wherein in the optimization analysis the control unit is configured to evaluate another signal from the current sensor, wherein the evaluation comprises evaluating the another signal output from an adaptable band pass filter, wherein the pass band thereof is varied over a range of frequencies, and if an evaluated another signal output from the adaptable band pass filter exhibits substantially no AC current components at one of the range of frequencies, then a determination is made that the presence of an electric fault is not attributable to an arc fault.

14. The photovoltaic power system of claim 11, wherein the arc fault detection system is fully or partially integrated into the inverter of the power system.

* * * * *